United States Patent [19]

Elmer et al.

[11] Patent Number: 5,382,895

[45] Date of Patent: Jan. 17, 1995

[54] SYSTEM FOR TOMOGRAPHIC DETERMINATION OF THE POWER DISTRIBUTION IN ELECTRON BEAMS

[75] Inventors: John W. Elmer, Pleasanton; Alan T. Teruya; Dennis W. O'Brien, both of Livermore, all of Calif.

[73] Assignee: Regents of the University of California, Oakland, Calif.

[21] Appl. No.: 996,892

[22] Filed: Dec. 28, 1992

[51] Int. Cl.⁶ .................. G01R 13/00; G01T 1/29
[52] U.S. Cl. .................. 324/71.3; 250/397; 250/396 ML
[58] Field of Search .............. 324/71.3, 404; 250/251, 250/305, 396 ML, 397

[56] References Cited

U.S. PATENT DOCUMENTS

| | | | |
|---|---|---|---|
| 4,336,597 | 6/1982 | Okubo et al. | 364/560 |
| 4,455,532 | 6/1984 | Gregory et al. | 324/71.3 |
| 4,480,220 | 10/1984 | Isakozawa et al. | 324/71.3 |
| 4,608,493 | 8/1986 | Hayafuji | 250/397 |
| 4,629,975 | 12/1986 | Fiorito et al. | 324/71.3 |
| 4,675,528 | 6/1987 | Langner et al. | 250/396 R |
| 4,703,256 | 10/1987 | Hayafuji | 324/71.3 |
| 4,962,317 | 10/1990 | Jason et al. | 250/396 ML |
| 5,017,779 | 5/1991 | Smith, Jr. et al. | 250/305 |
| 5,103,161 | 4/1992 | Bogaty | 324/71.3 |
| 5,153,430 | 10/1992 | Gammel et al. | 324/71.3 |
| 5,193,105 | 3/1993 | Rand et al. | 250/396 ML |
| 5,285,074 | 2/1994 | Haire et al. | 250/396 ML |
| 5,289,519 | 2/1994 | Rand | 250/396 ML |

FOREIGN PATENT DOCUMENTS

| | | | |
|---|---|---|---|
| 2700087 | 7/1978 | Germany | 324/71.3 |
| 0009566 | 1/1978 | Japan | 324/71.3 |
| 0021952 | 2/1978 | Japan | 324/71.3 |
| 0043051 | 2/1987 | Japan | 324/71.3 |
| 0284500 | 11/1988 | Japan | 324/71.3 |
| 1-307144 | 12/1989 | Japan | 324/71.3 |
| 0208593 | 8/1990 | Japan | 324/71.3 |

OTHER PUBLICATIONS

IBM Technical Disclosure Bulletin vol. 20 No. 11A Apr. 1978 Fortino et al. Faraday Corp Monitor for Ion Beam.

"A System For The Tomographic Determination Of The Power Distribution In Electron Beams", A. Teruya et al., Proceedings of the Conference on The Laser and Electron Beam in Welding, Cutting and Surface Treatment-State of the Art 1991, Published Jan. 1992 by Babish Material Corp., pp. 125-140.

UCRL-JC-111341, "Tomographic Imaging Of Non-Circular and Irregular Electron Beam Power Density Distributions", J. W. Elmer et al., Aug. 1992.

Primary Examiner—Maura K. Regan
Attorney, Agent, or Firm—Henry P. Sartorio; L. E. Carnahan

[57] ABSTRACT

A tomographic technique for measuring the current density distribution in electron beams using electron beam profile data acquired from a modified Faraday cup to create an image of the current density in high and low power beams. The modified Faraday cup includes a narrow slit and is rotated by a stepper motor and can be moved in the x, y and z directions. The beam is swept across the slit perpendicular thereto and controlled by deflection coils, and the slit rotated such that waveforms are taken every few degrees form 0° to 360° and the waveforms are recorded by a digitizing storage oscilloscope. Two-dimensional and three-dimensional images of the current density distribution in the beam can be reconstructed by computer tomography from this information, providing quantitative information about the beam focus and alignment.

15 Claims, 6 Drawing Sheets

SYSTEM FOR TOMOGRAPHIC DETERMINATION OF THE POWER DISTRIBUTION IN ELECTRON BEAMS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the measurement of the current density distribution in electron and ion beams, particularly to a technique using a modified Faraday cup to create an image of the current density of such beams, and more particularly to a system and method using a rotating modified Faraday cup in conjunction with computer tomography to determine the current density distribution in electron and ion beams.

Over the years, various apparatus have been developed for determining various characteristics of electron and ion beams, such as the beam configuration, diameter, energy peak, current density, spot size and edge width, etc. These prior approaches are exemplified by U.S. Pat. No. 4,336,597 issued Jun. 22, 1982 to T. Okubo et al.; U.S. Pat. No. 4,480,220 issued Oct. 30, 1984 to S. Isakozawa et al.; U.S. Pat. No. 4,629,975 issued Dec. 16, 1986 to R. Fliorito et al.; and U.S. Pat. No. 4,675,528 issued Jun. 23, 1987.

Electron beam machines have found wide application, particularly in the field of welding, surface modification, x-ray generation, electron beam lithography, electron microscopy, etc. With these applications has come the need for precise control of the beam focus and beam alignment, as well as a particular need for determining the power distribution in electron beams.

Reproducible electron beam processing can be made independent of the machine or the operator if the beam power distribution can be precisely controlled. Convention methods for setting the power distribution rely on the welding operator to visually focus the beam on a secondary target. The operator views the visible radiation or intensity of light given off rather than directly measuring the power distribution of the beam. This prior method is inherently imprecise, requiring significant operator experience and judgment to set the beam focus consistently. As readily seen, each operator may set the machine parameters differently due to each one's visual interpretation The current density distribution is influenced by many variables, including the filament design, focus setting, work distance, beam current, accelerating voltage, vacuum level, and filament alignment. Variations in these parameters may result in variations in the current density distribution of the beam, which can have a significant effect on the weld penetration, weld width, and surface quality of electron beam welded materials. Thus, it is seen that the conventional methods for setting the power distribution of electron beam machines has not been fully satisfactory. Thus, quantitative diagnostic methods such as the rotating wire device, the pinhole devices, and the modified Faraday cup (MFC) have been developed to more accurately determine the current density distribution and thereby more accurate control of the beam focus conditions. The Faraday cup approach is exemplified by U.S. Pat. No. 4,608,493 issued Aug. 26, 1986 to Y. Hayafuji; U.S. Pat. No. 4,703,256 issued Oct. 27, 1987 to Y. Hayafuji; and U.S. Pat. No. 5,103,161 issued Apr. 7, 1992 to J. M. Bogaty.

The rotating wire device operates by scanning a thin electrically conductive wire through the beam to sample the beam current. This early diagnostic method provided a means to measure the diameter of the beam, however, the accuracy of this method was limited by poor heat dissipation from the wire and difficulties associated with collecting back scattered and secondary electrons.

The pinhole devices provided another method for analyzing the spatial distribution of current of non-uniform electron beams using a pinhole aperture to sample the current density. By rastering the beam over a pinhole, current density measurements can be acquired at regularly spaced intervals throughout the cross-section of the beam. Therefore, the current density, and thus the power density distribution, can be determined without making any assumptions about the beam symmetry. Although this method has the ability to map the spatial distribution of power in the beam, it tends to have a high signal-to-noise ratio due to the fact that only a small percentage of the beam is transmitted through the pinhole, and inaccuracies caused by damage to the pinhole while acquiring data are not correctable.

The modified Faraday cup (MFC) devices involve sweeping the electron beam across a narrow slit. The major limitation of the MFC method is that the beam is assumed to be radially symmetric with a circular cross-section in order to measure the current density distribution with a single scan.

When a beam with a radially symmetric Gaussian current density distribution is integrated along one dimension, as is done by the slit, the result is a one dimensional Gaussian waveform which is a good indication of the quality of the beam. However, when an irregularly distributed (non-uniform) beam current is similarly integrated, the result is an irregularly shaped waveform which, by itself, tells little about the beam's power distribution. Such non-uniform beams tend to take on an elliptical or irregular cross-section power distribution, and tend to produce non-symmetric welds or processing conditions. The geometric shape of these welds varies with the orientation of the beam with respect to the weld direction, and an accurate method for measuring the current density distribution is required in order to precisely control the welding process. Fortunately, a number of measured waveforms taken at different slit angles can be used to reconstruct the beam current density distribution using computed tomography (CT) algorithms developed for the non-destructive evaluation of solid objects, thus providing information about non-symmetric beam distributions.

Computed tomography imaging has been developed in recent years to reconstruct the interior structure of objects using x-ray data, as described in "Computerized Tomography Reconstruction Technologies", Energy and Technology Review, November–December 1990, S. G. Azevedo et al., UCRL-52000-90-11.12, pp. 18–34. In this method an object is scanned using an x-ray source and a detector or a detector array. Detected x-rays follow a line connecting the x-ray source and the detector. This ray trace is analogous to the narrow slit on the MFC. The detected x-ray intensity will vary depending on the densities of materials in the path, just as the current measured through the MFC will depend on the current density along the slit. The waveform resulting from a scan is called a projection. The object is rotated and scanned at angles between 0–180 degrees, as scanning more than 180 degrees produces redundant data. The projections are processed and used to reconstruct the beam current density distribution. The greater the number of angles, the greater the accuracy of the reconstruction. In reconstructions where fine detail of the solid object is required, increments of one degree or less may be used.

In view of the need to provide an approach for measuring the current density distribution in electron beams, it has been recognized that by combining a modified Faraday cup with the computer tomographic technique and rotating the Faraday cup, a tomographic determination of the power distribution in electron beams could be obtained, thereby resulting in the present invention. The modification of the Faraday cup (MFC) involves rotating the cup in a selected sequence, such as by a stepper motor which allows for repeated rotation of the MFC and reorientation of the MFC slit angle, with deflection coils used in sweeping the beam across the slit, thereby producing beam current waveforms which are measured with a current viewing resistor and recorded with a device such as a digital storage oscilloscope, whereafter the waveforms are reconstructed utilizing computer tomography to produce a surface plot of the power density distribution of the electron beam.

SUMMARY OF THE INVENTION

An object of the present invention is to provide a technique for determining the power distribution in electron or ion beams.

A further object of the invention is to provide a method and apparatus for determining the profile data of an electron or ion beam.

A further object of the invention is to provide a method for measuring electron beam current density using a rotating Faraday cup and a computer tomographic technique.

A further object of the invention is to provide an apparatus for determining electron beam current density which includes a rotating modified Faraday cup having a slit across which the beam is directed in a controlled manner for producing output signals which can be used for various purposes including computer tomographic reconstruction showing the power distribution of the beam.

Another object of the invention is to provide a modified Faraday cup having means for rotating same in a selected, controlled manner.

Another object of the invention is to provide a computer tomographic technique to measure current density distribution in electron beams.

Another object of the invention is to provide a computer tomographic technique to create an image of the current density in low and high power beams using beam profile data acquired from a rotatable modified Faraday cup.

Another object of the invention is to provide a method for acquiring electron beam profile data by sweeping the beam across a narrow slit in a Faraday cup, with the slit being repeatably rotated by selective amounts and the beam current waveforms being recorded at regularly spaced angles.

Other objects and advantages will become apparent from the following description and accompanying drawings which serve to explain the principles of the invention. Basically, the overall invention involves a computer tomographic technique to measure the current density distribution in an electron beam which is swept across a narrow slit in a Faraday cup which is rotated in a stepped arrangement such that the beam waveform is recorded at regularly spaced angles by a digitizing storage oscilloscope, the recorded waveforms providing the input for the computer tomographic technique. The invention uses a rotatable modified Faraday cup incorporating tungsten slit blocks machined with an included angle, such as 10°, that face away from the beam, and the current passing through the tungsten-formed slit and into an electrically insulated Faraday cup is measured via a current viewing resistor and recorded with a digital storage oscilloscope to provide a beam profile. The modified Faraday cup (MFC) is rotated by a stepper motor that allows for repeated rotation of the MFC and reorientation of the slit angle and rotation of the scan direction of the beam. The MFC is rotated and stopped at selected angles (degrees of rotation) to provide beam current waveforms taken over a series of predetermined angles to provide a beam profile.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

Figure 1:
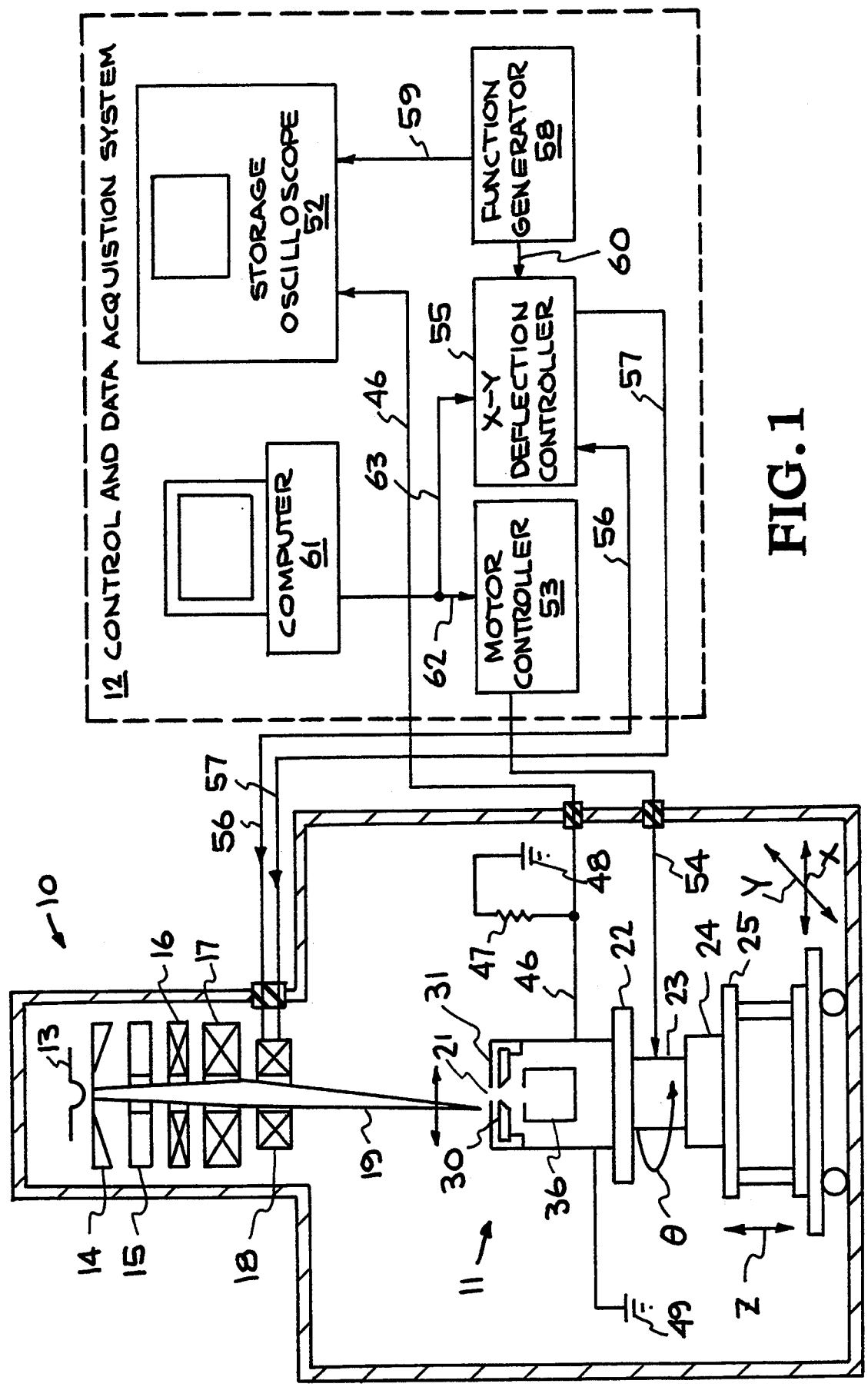
FIG. 1 is a schematic illustration of a data acquisition system for acquiring electron beam profile data.

The present invention is broadly directed to a computer tomography (CT) diagnostic technique for high resolution imaging of the current density distribution in electron beams. The invention may also be utilized for power distribution determination in ion beams. This technique measures the electron beam (EB) profile by integrating the current density of the beam along a thin slit, and CT reconstructs the current density distribution from multiple profiles taken at equally spaced angles around the beam. By using CT imaging, the current density distribution of non-circular and irregular electron beams can be quantified in order to characterize the quality of the electron optical system and the quality of the electron beam.

More specifically, this invention uses electron beam profile data acquired from a modified Faraday cup (MFC) to create an image of the current density in high and low power beams. The beam profile data is acquired by sweeping the beam across a narrow slit in the MFC. The beam current, integrated along the axis of the slit, is captured by the MFC and its waveform is recorded by a digitizing storage oscilloscope. The slit is repeatedly rotated and beam current waveforms are recorded at regularly spaced angles (degrees of rotation). A two-dimensional image of the beam's current density distribution in the plane of the rotated slit is reconstructed via computer tomography from this information, providing quantitative information about the beam focus and alignment.

As set forth above, CT imaging has been previously developed to reconstruct the interior structures of objects using x-ray data, wherein an x-ray trace is analogous to the narrow slit on the MFC, and the x-ray intensity will vary depending on the densities of materials in the path, just as the current measured through the MFC will depend on the current density along the slit. The waveform resulting from a scan is called a projection. In the prior CT x-ray imaging techniques, the object was rotated and scanned at angles between 0-180 degrees. Similarly in this invention the MFC is rotated from 0° to 180° in a repeated manner and the beam is swept back and forth across the slit at each desired degree of rotation. These projections are processed and used to reconstruct the beam current density distribution. The greater the number of angles (scans during rotation) the greater the accuracy of the reconstruction. For more detailed information relative to the CT technology and the use thereof in the experimental verification of the present invention, see the article entitled "A System For The Tomographic Determination Of The Power Distribution In Electron Beams", A. Teruya et al., Proceedings of the Conference on the Laser and the Electron Beam in Welding, Cutting and Surface Treatment State of the Art 1991, published 1992 by Bakish Materials Corporation, pp. 125-140.

In further investigation involving this invention, sharp focused and defocused multi-kilowatt electron beams produced by hairpin and ribbon filaments were tested using the MFC and CT imaging. These tests showed that significant differences exist between the power density distribution produced by these different filament shapes. The results of this investigation further showed the influence that beam current and focus conditions have on the peak power density and the power density distribution for both hairpin and ribbon filaments, such as used in electron beam welding machines. This information can be used for accurate transfer of welding parameters to different machines, improving the understanding of electron beam/material interactions, and generating tailored power density distributions for improved electron beam welding and surface treating of materials. For further details relative to the investigation on the effect of the different filament shapes on the power density distribution of electron beams using the present invention, see "Tomographic Imaging of Non-Circular and Irregular Electron Beam Power Density Distributions", J. W. Elmer et al., UCRL-JC-111341, dated August 1992.

Figure 3C:
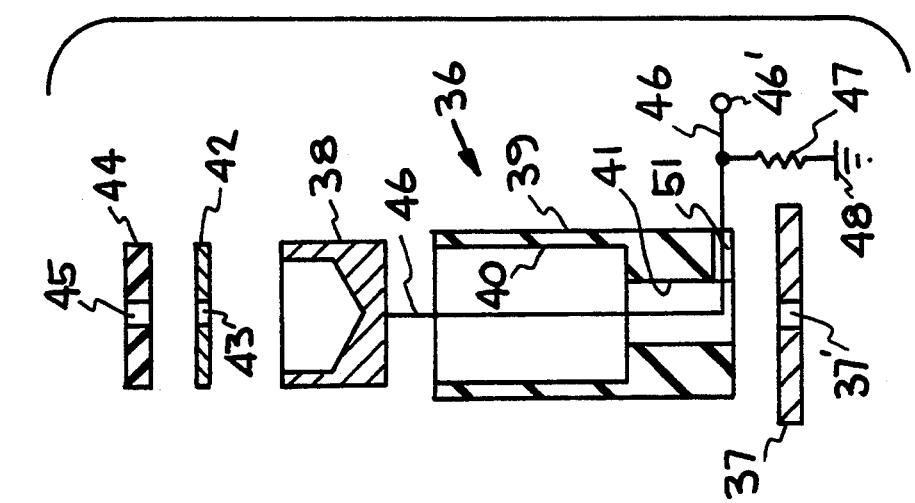
FIGS. 3a–3c illustrate a top, partial cross-section, and partial exploded views of a modified Faraday cup (MFC) utilized in the FIG. 1 apparatus.
Figure 3B:
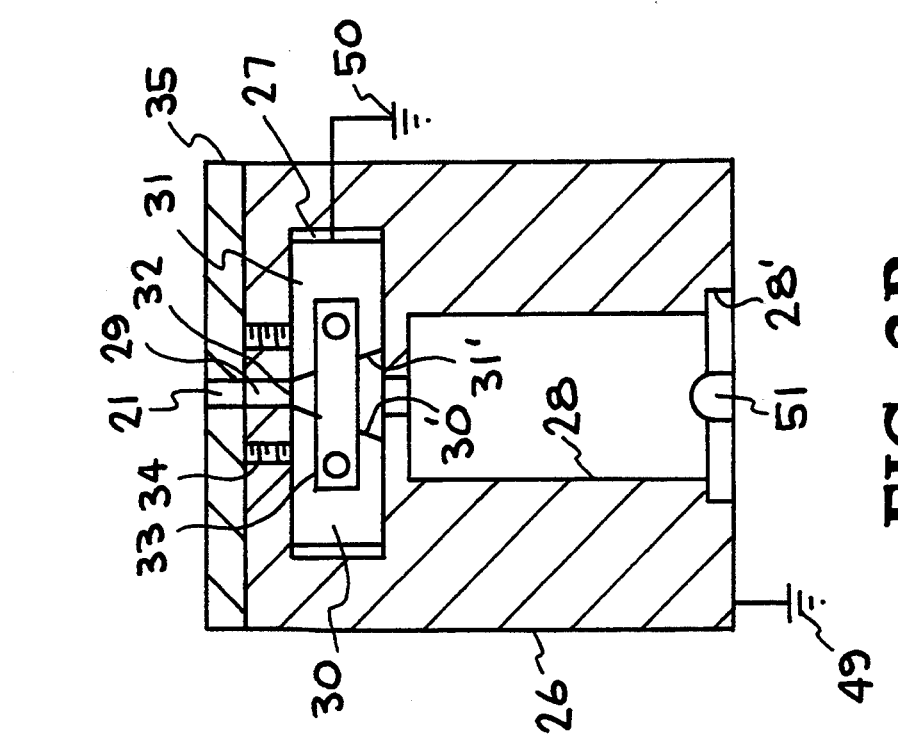
Figure 3A:
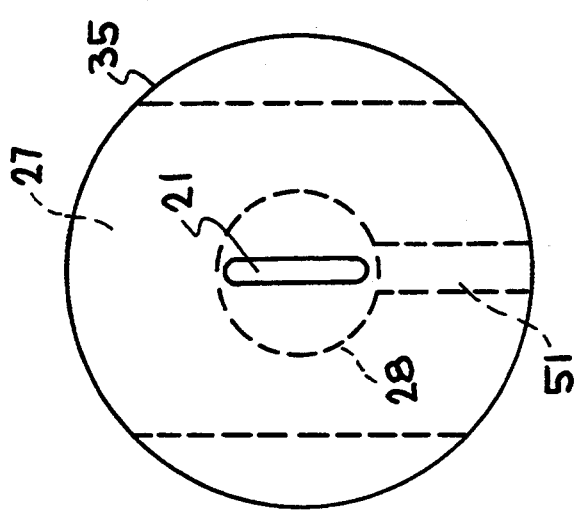

FIG. 1 schematically illustrates an embodiment of the modified Faraday cup (MFC) system of the present invention for taking electron beam profile data; with the details of the MFC being illustrated in FIGS. 3a-3c. Basically, the FIG. 1 system involves three (3) interconnected components or systems: an electron beam gun generally indicated at 10, a rotatable/movable MFC assembly generally indicated at 11, and a control and data acquisition system generally indicated at 12. System 12 functions to control elements of the gun 10 and the MFC assembly 11 as well as storing the acquired data.

Figures 2A, 2B:
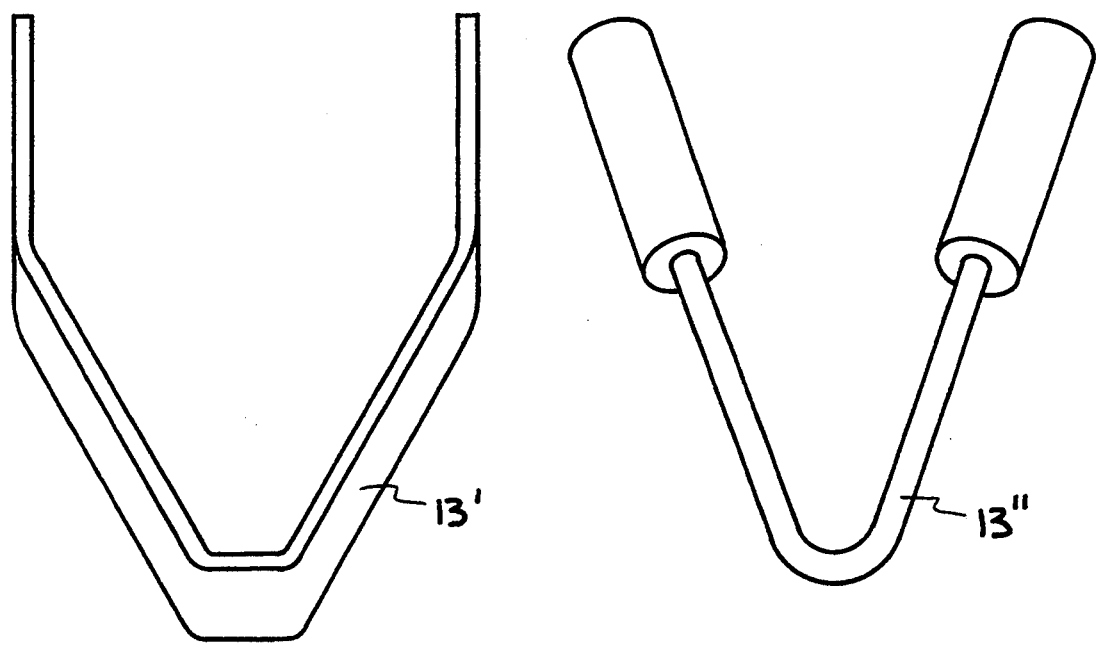
FIGS. 2a and 2b illustrate embodiment of ribbon and hairpin filaments used in the apparatus of FIG. 1.

The electron beam gun 10, such as may be used in a welding machine, basically comprises a filament 13, cathode 14, anode 15, alignment coil 16, magnetic lens 17, and deflection coils 18. The filament 13 may be of any desired cathode configuration, such as the ribbon type shown in FIG. 2a and indicated at 13', or of the hairpin type shown in FIG. 2b, and indicated at 13". The various components of the gun 10 and details of the filaments 13' and 13" are known in the art and do not constitute part of this invention. Thus, further description relative to the construction thereof is believed unnecessary to enable an understanding of the present invention, except that the deflection coils 18 are connected so as to be controlled by system 12 to deflect an electron beam produced by gun 10 and indicated at 19 in x and y directions as indicated. The beam 19 is moved via deflection coils 18 to sweep across a slit in the MFC 11 as indicated by the double-pointed arrow.

The rotatable/movable MFC assembly 11 comprises an MFC 20, having a slit therein indicated at 21, mounted on a support 22 connected to a rotatable member or stage 23 including a stepper motor 24 mounted on a movable assembly 25 composed of x, y and z translation stages, providing capability of movement in the x, y, and z directions as indicated by arrows. By mounting the MFC 20 onto the stage 23 and stepper motor 24, such allows for controlled, repeated rotation of the MFC 20 and reorientation of slit 21 angle, described hereinafter. The z-transition stage allows the MFC 20 to be positioned above and below the point of best focus. The x-y translation stages are used to provide horizontal movement for beam 19 alignment purposes. Beam current waveforms are taken with the MFC 20 and slit 21 being stationary by sweeping the beam 19 perpendicularly across the slit 21 via the beam deflection coils 18.

MFC 20, as illustrated in detail in FIGS. 3a-3c, comprises a cylindrical body or housing 26 having interconnected therein an internal cavity 27, an open end cavity 28 and a slit 29; a pair of blocks 30 and 31 having tapered or beveled surfaces 30' and 31' and forming a slit 32 there between are mounted in internal cavity 27 via a pair of slit clamps 33, only one shown, and set screws 34 secured to housing 26, such that slit 32 is in alignment with slit 21 formed in a plate 35 mounted on housing 26, and with slit 29 in the housing; and a Faraday cup assembly generally indicated at 36, illustrated in FIG. 3c, is adapted to be mounted in open end cavity 28 and retained therein by a retainer plug 37, having a central opening 37', which is mounted in an enlarged end 28' of cavity 28. Thermal expansion of slit 32 between blocks 30 and 31 may be further minimized by placing a copper housing around MFC 20 to absorb the majority of the beam's energy. The Faraday cup assembly 36 includes a Faraday cup 38, an insulator 39 having openings 40 and 41 therein, a cap 42 having a slot 43 therein, and an insulator 44 having a slot 45 therein. Faraday cup 38, cap 42 and insulator 44 are positioned in opening 40 in insulator 39 and insulator 39 is retained in opening 28 of housing 26 by plug 37. An electrical lead or cable 46 secured at one end to Faraday cup 38 extends through openings 41 and 51' in insulator 39 and through passage 51 in housing 26 and is connected to a current viewing resistor 47, and to a digital storage oscilloscope in system 12 (see FIG. 1). The current collected by the cup 38 produces an output signal indicated at 46' in FIG. 3c that passes through the cable 46 to the outside of a vacuum chamber, not shown, containing housing 26 via a vacuum, feedthrough and sinks to a common ground as indicated at 48 through the current viewing resistor 47. The voltage across the resistor 47 is measured by the digital storage oscilloscope of system 12, which stores the data on a floppy disk. Housing 26 is electrically connected to the common ground as indicated at 49, while blocks 30 and 31 are connected to common ground as indicated at 50. While grounds 48, 49 and 50 are individually identified, they are common in actual practice.

By way of example, housing or body 26 may be constructed of a high thermal conductivity material such as copper, nickel, silver, or similar metals and alloys, 75 mm in diameter and 75 mm high, with the opening 27 having a cross-section of 2¼ inch and height of ½ inch, with the opening 28 having a 1 inch diameter and length of 2⅛ inch, and open end 28' having a 1½ diameter and depth of ⅛ inch; and with slit 29 having a length of 1 inch and width of about ¼ inch. The slit blocks 30 and 31 are constructed of refractory metals or alloys such as tungsten, tantalum, or tungsten-rhenium, with a length of 2 inches, width of 1 inch, and height of ⅜ inch, with the tapers or bevels 30' and 31' being at a 10 degree angle, and with the slit 32 formed there between having a width of 0.002–0.005 inch. The slit clamp 33 is formed from the same material as the slit blocks, with a thickness of 3 mm (⅛ inch), and the sets screws 34 may be stainless steel or steel and hold the tungsten blocks 30 and 31 against the copper housing 26 to increase heat transfer from the blocks to the housing. The Faraday cup 38 is constructed of copper and is 25 mm in diameter and 35 mm high, the insulators 39 and 44 are constructed of a high melting point, electrically insulating material, such as a ceramic with the plug 37 and cup 42 being constructed of the same material as the Faraday cup (copper). The plate 35 is made of the same material as the slit blocks, such as tantalum, tungsten, or tungsten-rhenium, with the same diameter as housing 26, a thickness of ¼ inch, with the slit 21 having a length of 1 inch and width of ¼ inch.

By way of example the resistor 47 may be 100 ohms. The grounding wires, indicated at 49 and 50 between the tungsten slit blocks, the copper body and the interior of the vacuum chamber, in which the body is located, serve to prevent charge build-up. The slots 43 and 45 in cup 42 and insulator 44 align with the slit 32 and prevents the loss of signal due to reflected electrons. The tantalum plate 35 serves to protect the top of the body or housing 26 from the electron beam 19. The tungsten slit blocks 30 and 31 are tapered beveled to avoid beam reflection into the Faraday cup 38. While the beveled or tapered surfaces 30' and 31' are exemplified as being at a 10 degree angle, the angle can be increased or decreased by about 2–4 degrees, but must be sufficient to prevent beam reflection and/or secondary electrons and not so wide as to reduce the thickness of the blocks 30 and 31 adjacent the slit 32 which would result in damage due to the heat generated by the electron beam passing there through. The slit 32 while exemplified above as having a width of 0.002–0.005 inch and a length of 1 inch may be greater or smaller depending on the configuration and energy of the electron beam 19. A narrower slit is more precise than a wider slit and the slit must have a length of at least the diameter or cross-section of the beam 19, but can be longer than the beam diameter. A general ratio of slit width to beam diameter is about 1 to 10. The MFC embodiment illustrated in FIGS. 1 and 3a–3c is designed for high power electron beam welding applications using a voltage of 20 kV to 150 kV and current of 1 mA to 250 mA. However, the invention may be used on lower power beams down to 1 kV for television, electron microscope (10's of kVs), and medical x-ray generation applications, for example. With the lower power application, different materials, dimensions, etc. of the MFC may be utilized due to the lower heat generation. Also, for higher power applications (up to 300 kV and 1000 mA) the MFC 20 may be mounted in a liquid cooled housing to absorb heat from the beams.

The control and data acquisition system 12 of FIG. 1 includes a digital storage oscilloscope 52 into which the output signal 46' via lead or cable 46 is directed; a motor controller 53 electrically connected as indicated at 54 to stage 23 and stepper motor 24; an x-y coil deflection controller 55 electrically connected as indicated at 56 and 57 to deflection coils 18 of electron beam gun 10; a function generator 58 electrically connected to oscilloscope 52 and deflection controller 55 as indicated at 59 and 60; and a computer 61 electrically connected to motor controller 53 and deflection controller 55 as indicated at 62 and 63. The computer 61 may be a personal computer (PC) such as an IBM AT Computer (PC/AT).

The MFC 20 is positioned on rotating stage 23 containing stepper motor 24 which is controlled by motor controller 53 so as to provide selected, periodic, repeated rotation of the MFC and reorientation of the angle of the slit 32 with respect to the sweep of beam 19. The z-translation stage of moveable assembly 25, as indicated the legend z-control, allows the MFC 20 to be positioned above or below the estimated point of best focus, and translated through the point of best focus. The x-y translation stage of assembly 25 is used to provide horizontal movement for beam alignment purposes. Beam current waveforms are taken with the MFC 20 and slit 21 stationary by sweeping the beam 19 across the slit 21 with the beam deflection coils 18 which is controlled by deflection controller 55. The degree of rotation of the MFC is dependent on the design of the stepper motor and the number of beam profiles desired, such that the MFC is rotated in repeated degree increments through a range of 0 to 180 degrees. The increments may be determined by the number of waveforms desired. For example, if 25 beam profiles are desired for beam reconstruction then the waveforms would be taken at 7.2° increments (180/25), and if 50 beam profiles are desired for beam reconstruction then the waveforms would be taken at 3.6° increments (180/50). In beam reconstruction, the greater number of beam profiles provide for finer detail of the beam, and thus under certain conditions, increments of one degree or less may be obtained. For easiest reconstruction the beam 19 should sweep across slit 21 perpendicular to the slit. However, while a perpendicular sweep of beam 19 across slit 21 is preferred, a plus or minus of up to 90° from the perpendicular will in most instances provide an acceptable waveform, provided of course that the slit is of sufficient length to allow the diameter of the entire beam to be swept across the slit. However, an angular accuracy of ±10° can be tolerated when the beam is swept perpendicular to the slit. This tolerance gets smaller as a function of the cosine of the angle between the sweep direction and a line perpendicular to the slit. Where the beam sweep is not perpendicular to the slit and the slit is long enough and is uniform in width, and provided such is recognized, and the exact angle is known, the waveform and thus the resulting beam profiles can be compensated for during the computer tomographic reconstruction.

While the x, y, and z movements of the MFC are adjusted manually by the operator, the MFC is rotated and the slit angle (degree of rotation) set by computer control via computer 61 and controllers 53 and 55 of system 12. Software and hardware for the computer 61 have been developed which allow the operator to specify an angle and let the computer rotate the MFC to the desired position. While in the set-up mode, the MFC can be rotated at the finest angles available on the stepper motor. When in operation mode, the MFC can only move sequentially to angles (degrees of rotation) predesigned for beam profile reconstruction. At each set angle, the MFC and slit are stationary during the sweep of the beam perpendicularly across the slit.

Sweeping the beam 19 across the slit 21 is done using the beam deflection coils 18 of the EB gun 10 and the external electronics of system 12. The beam sweep is controlled with the function generator 58 which provides a triangle wave with the desired period and amplitude. The x-y deflection controller 55, which was designed to perform polar-to-rectangular conversion, receives the triangle sweep signal 60 from generator 58 and an angle value (degree of rotations) signal 63 from the computer 61, and generates a pair of signals 56–57 for the x-y beam deflection coils 18. In order to minimize the chance of damage to the MFC, fast scan speeds (200 to 500 inch/sec.) for the beam deflection are used, but they must also allow the capture of an adequate number of data points by the digitizing oscilloscope 53.

Figure 5:
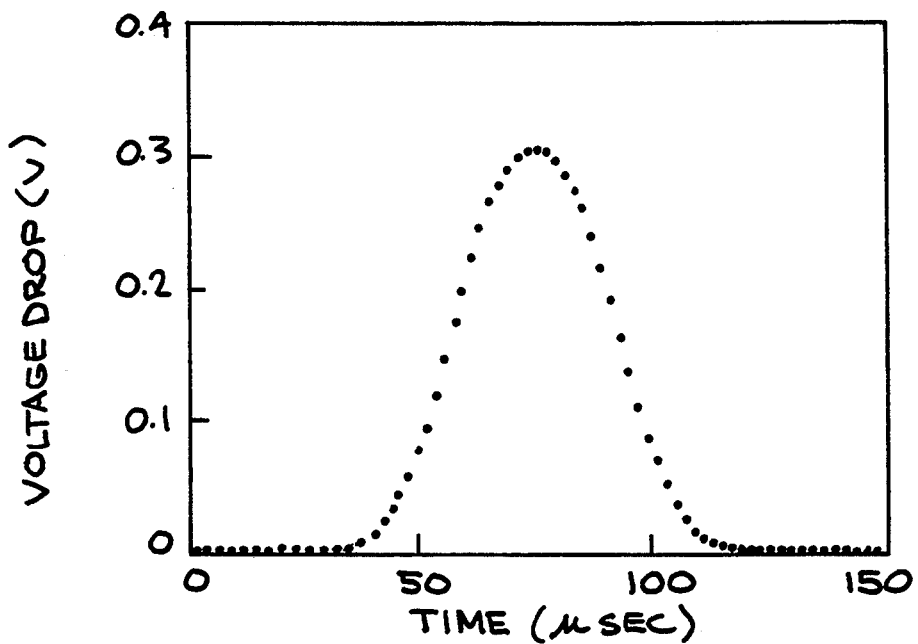
FIG. 5 is a graph of a single scan electron beam profile showing the voltage drop across the current viewing resistor as a function of scan time.

Data is taken by sweeping the beam 19 orthogonally across the slit 21 and measuring the beam current passing through the slit using Faraday cup assembly 36. This integrated slice of beam current is measured with the current viewing resistor 47 and recorded with the digital storage oscilloscope 53 as the beam 19 moves across the slit 21, producing a time record referred to as a beam profile. Such a single scan electron beam profile showing the voltage as a function of scan time is illustrated in FIG. 5. Knowing the beam sweep speed and the value of the current viewing resistor, the integrated beam current is determined as a function of position. These beam profiles are stored in oscilloscope 53. The data is later transferred to a conventional computer workstation capable of running the software for processing and CT reconstruction of the beam profile. Such conventional stations may, for example, be a VAX or SUN station.

After the beam is focused, by the z-control of assembly 25, or by adjusting the focus coil current, the slit and direction of beam sweep are set perpendicular to each other by the x-y translation stage of assembly 25 and the controllers 53 and 55. Once this is done, the computer controlled electronics maintains the perpendicular alignment at each sweep angle (degree of rotation). With the triangle sweep signal 60 applied to the x-y deflection coils 18, the beam 19 is turned on, given time to stabilize and the waveform from the modified Faraday cup is captured on the oscilloscope 53. A number of Gaussian-like peaks are captured in each waveform record as the beam sweeps back and forth over the slit.

Figure 4:
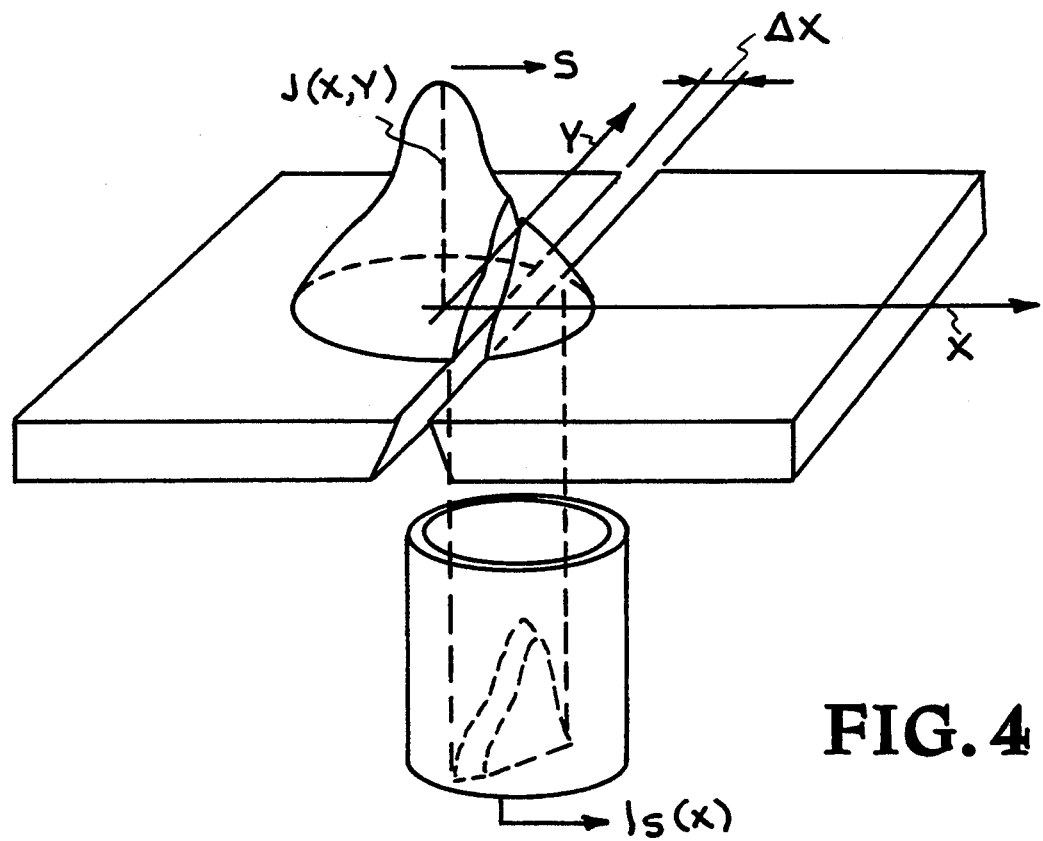
FIG. 4 is an illustration of a current distribution passing over the thin slit in the MFC of the FIG. 1 apparatus.

The operation of the MFC technique is illustrated in FIG. 4. Here a current distribution is schematically shown to be moving in the x-direction at a constant travel speed S, over a slit of width $\Delta x$. The amount of current, $I_s(x)$, passing through this slit at any given time is given by:

$$I_S(x) = \Delta x \int_{-\infty}^{\infty} J(x,y) dy \quad (A),$$

where $J(x,y)$ is the current density distribution in the beam incident on the x,y surface.

The current density distribution of the electron beam may take on a number of forms. Two common forms that have analytic descriptions are the circular and elliptical Gaussian distributions. For a circular Gaussian distribution, the current density is given by:

$$J(x,y) = \frac{I_B}{2\pi\sigma_c^2} \exp[-(x^2+y^2)/2\sigma_c^2] \quad (A/mm^2).$$

In this expression, $I_B$ is the total beam current and $\sigma_c$ is the standard deviation of the circular Gaussian beam. For an elliptical Gaussian distribution, the current density is given by a similar expression:

$$J(x,y) = \frac{I_B}{2\pi\sigma_a\sigma_b} \exp\left(\frac{-(x')^2}{2\sigma_a^2} + \frac{-(y')^2}{2\sigma_b^2}\right) \quad (A/mm^2),$$

where $\sigma_a$, $\sigma_b$ are the standard deviations of the major and minor axes of the elliptical Gaussian distribution respectively, and $x'$ and $y'$ refer to the directions along the major and minor axes of the ellipse respectively. The coordinate transformation to the primed axes represents a rotation through an angle, $\theta$, with respect to the unprimed axes.

For both the circular and elliptical Gaussian beams operating at a constant acceleration voltage, the power density distribution, $P(x,y)$, is the product of the current density distribution and the voltage:

$$P(x,y) = J(x,y) V_a (kW/mm^2),$$

where $V_a$ is the accelerating voltage of the beam. Therefore, the power density distribution of a circular Gaussian beam can be calculated from a single sweep of the beam over the MFC to determine $\sigma_c$. However, the power density distribution of an elliptical Gaussian beam has two distribution parameters, $\sigma_a$ and $\sigma_b$, which cannot be calculated from a single scan, but can be calculated by tomographic reconstruction from multiple scans taken at different angles around the beam. The distribution parameters $\sigma_a$, $\sigma_b$ and $\sigma_c$ are often related to the diameter of the beam at 50% of the peak amplitude, which is defined as the full width at half maximum amplitude, FWHM, of the beam. The $FWHM_a$, $FWHM_b$ and $FWHM_c$ parameters can be calculated by multiplying $\sigma_a$, $\sigma_b$ and $\sigma_c$ respectively, by a factor of 2.35.

Defocused electron beams and electron beams generated by temperature-limited filaments frequently have complex power density distributions. These beams may be highly irregular and cannot be described by analytic expressions. However, since computer tomography does not require J(x,y) to be described by an analytic expression in order to measure its power distribution, CT imaging can he used to analyze complex non-symmetric beams as easily as symmetric beams.

FIG. 5 shows an oscilloscope trace for a typical electron beam as measured by the MFC. The x-axis is plotted in $\mu s$, and represents the elapsed time as the beam travels over the slit. This axis can be converted into beam position through the relationship: $x = \tau.S$, where x represents the position of the beam, t is the scan time and S is the scan speed of the beam. The y-axis plots the voltage drop across the current viewing resistor, and can be converted into slit current through the relationship: $V_m(x) = I_s(x)R$, where $V_m(x)$ and $I_s(x)$ are the measured voltage drop and slit current respectively as functions of x, and R is the resistance of the current viewing resistor.

The procedure for taking data during the experimental verification of the invention consisted of using the x and y table movements and the MFC rotation to align the MFC in the EB chamber so that the center of the slit was positioned directly below the dead-center position of the electron beam. With the beam turned off, the function generator was activated so that the beam would be deflected to one side of the slit. Once the beam was turned on and the full beam current was established, the beam was scanned back-and-forth over the slit. Two beam profiles were captured by the oscilloscope as the beam crossed the slit and returned to its initial position. The beam profiles were visually inspected on the oscilloscope prior to storing them as a permanent record on the disk. Once the data was recorded, the MFC was rotated by the computer to its next position prior to taking the next profile. This process was repeated until the entire beam (360°) had been analyzed.

Figure 6:
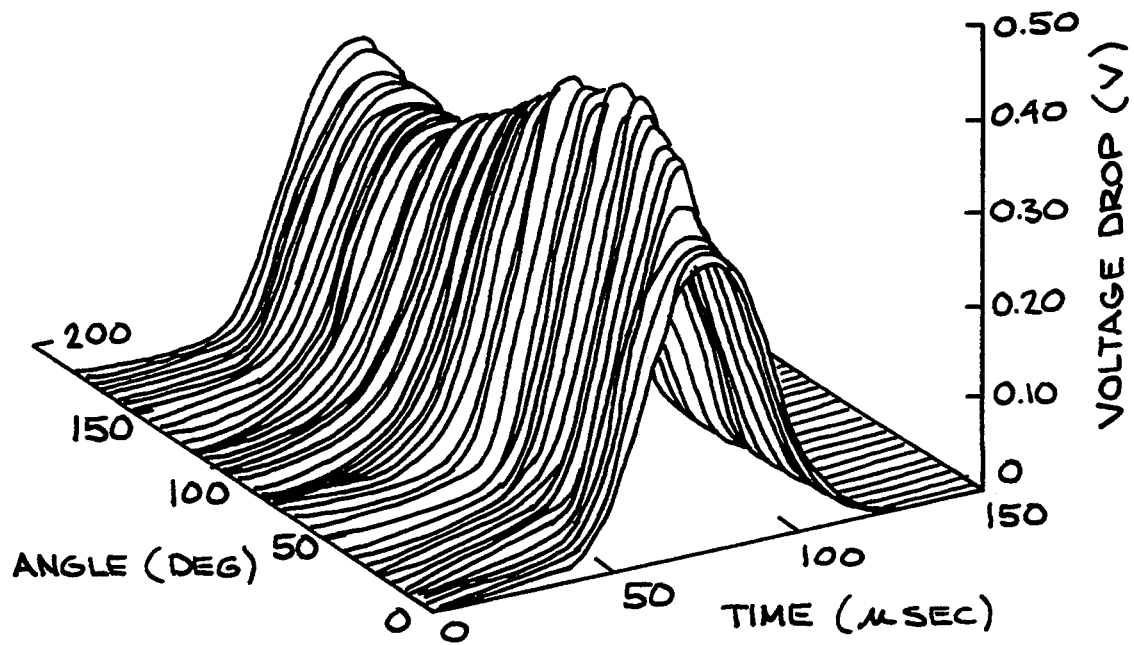
FIG. 6 illustrates a sinogram showing fifty beam profiles taken at 3.6° increments from radial scans back and forth across the beam between 0° and 176.4° which covers 360° of the beam after opposing beam profiles were added together.

A typical tomographic run consisted of gathering 25 beam profiles taken at 7.2° increments through 180°. Some runs were made with higher rotational precision and consisted of 50 beam profiles taken at 3.6° increments as illustrated in FIG. 6.

There are several different techniques for reconstructing a two-dimensional image from a set of projections (waveforms at a given sweep angle), a process known as backprojection. See A. C. Kak et al., Principles of Computerized Tomographic Imaging, IEEE Press, New York, N.Y., 1988, pp. 60. A modification of this process has been developed which provides two and three-dimensional image and is a method of backprojecting of filtered projections. See above referenced document UCRL-90-11.12 by H. E. Martz et al. This process for creating the backprojected image consists of five steps: scaling, filtering, smearing, rotating, and adding.

Since each beam profile contains the integrated beam current, scaling is done by dividing each data point in the profile by the number of data angles to compensate for the number of times this data is added to the backprojection. A filter within the frequency domain is then applied to the projection. The Fast Fourier Transform (FFT) of the projection is multiplied by a filter that emphasizes high frequency components. The inverse FFT returns the filtered projection which is then smeared vertically to form a two-dimensional image where each row is the filtered projection. This image is then rotated to the angle of the measurement, and the rotated image is added to a summing image. As this is done for more and more projection angles, the peaks in the profiles reinforce each other and become prominent, and the summing image becomes a representation of the density distribution. This image may then be displayed as a pseudo-color image, as a contour plot, or as a 3-d representation with the current density being represented in the third dimension.

The waveform data is transferred to a conventional workstation computer and prepared for backprojection using a commercial image processing software package. Uniformly long data arrays containing the selected current peaks at each sweep angle are extracted from the data records and combined to form an image called a "sinogram". The sinogram is the first step in the reconstruction and is the first chance to examine the quality of the entire data set. The waveforms for each angle form a row in the sinogram. With 20 angles equally spaced at nine degree increments between 0° and 171° and 200 points in each waveform peak, the sinogram image is 200 pixels wide and 20 pixels high. The term sinogram comes from the fact that a prominent feature not at the center of rotation of the image will appear in different positions in each row and seem to roam across the image in a sine wave pattern.

The areas under the waveform peaks for all angles in the sinogram are normalized to remove the effects of time varying changes of magnitude of the beam current. It is also important to have all of the profiles in each row of the sinogram aligned so the center of rotation is at the center of each row. Most CT systems have the x-ray source and detector and the rotating stage permanently aligned so the center of rotation is well known. Physical limitations make it almost impossible to align the center of the slit, the axis of the rotating stage, and the axis of the electron beam with the precision and accuracy needed for tomographic reconstruction. Consequently, a method For finding an artificial "center of rotation" is used.

Just as an object has a center of mass which is the point where the entire mass may be considered as concentrated, the beam current distribution will have a center of current density. For any arbitrary angle, a center of masstype calculation will provide the position of the center of current density within a profile. Since this is the only point that can be determined reliably for any profile, it is used as the "center of rotation" placed at the center of each row in the sinogram.

The MFC method acquires two peaks for every cycle of the function generator as the beam scans one direction and then back to its starting point. Since the second peak is acquired when the sweep is returning, this peak represents data taken at an angle 180 degrees from the initial scan angle. Prior to tomographic analysis, the second peak is reversed and averaged with the first peak. This averaging reduces noise input to the reconstruction.

The sinogram image produced with the image processing software package, such as a PV-Wave, is then transferred to a conventional workstation computer, such as a Sun workstation. Filtered backprojection software on the workstation is used to produce tomograms (CT-reconstructions) from the sinogram data.

Tomograms are then transferred back to the initial workstation and image processing software for examination and final processing.

As set forth above, tomographic analysis of the EB power distribution consists of combining the individual beam profiles, such as shown in FIG. 5, into a "Sinogram" which is the first step in the reconstruction process and allows individual beam profiles to be qualitatively compared. CT reconstruction if then performed on the sinogram in order to reconstruct the power density distribution of the electron beam.

The beam profiles were analyzed using imaging software running on a computer workstation in order to generate the sinogram data file that was used as the input file for the tomographic reconstruction. The first processing step in tomographic reconstruction registered the centroid of each profile at the same temporal location using a center of mass type calculation. This adjustment was necessary because the beam profile was randomly located in the data-file record. A second adjustment was made to the beam profiles in order to normalize the area under each curve so that all profiles have the same area. This adjustment is valid for constant current beams and was necessary because of small changes in the slit width that are caused by erosion of the slit block or thermal expansion related widening of the slit during repeated scans. The areas under the curves typically required a ±5% normalization factor to bring them to the same value.

Tomographic reconstruction was then performed on the beam profiles using a filtered backprojection algorithm similar to NDE techniques. In this technique each profile is transformed into the frequency domain using a Fast Fourier Transform (FFT). A ramp filter is then applied to emphasize high frequency components, and the filtered projection is returned to the spatial domain. A two-dimensional image is created where each row is a replication of the filtered profile. Each of these images is rotated to the angle at which the profile was acquired, and the sum of these rotated images is the reconstruction. The summing process emphasizes the course structure of the image, which appears in all profiles and balances out the emphasis on high frequency components that are created by the ramp filter. The final step in the reconstruction is to normalize to the total power of the beam.

While a tomogram has the shape of the distribution, it must still be scaled to correspond to the units of current density or power density. This is done by normalizing the reconstruction so the integral of the reconstructed beam is equal to the beam current and the tomogram is in the units of Amperes per pixel. In order to convert to units of Amperes per square meter the value for each pixel is divided by the area of a pixel (the square of the distance corresponding to each point in the profile). If the power distribution is required, the value of each point is multiplied by the accelerating voltage.

During early experimental verification of this invention a comparison was made of the focusing ability of an experienced electron beam machine operator with that of the MFC, as illustrated in FIG. 1, and which clearly illustrated the advantages of the MFC method. The result of this comparison and other experiments relative to this invention are set forth in above-referenced article by A. Teruya et al. published by Bakish Materials Corporation.

FIG. 6 illustrates a typical sinogram which appears as a series; of beam profiles stacked next to each other. This figure shows 50 beam profiles taken at 3.6° increments. The x-axis represents the scan time, which can be converted to spatial distance knowing the beam scan speed; the y-axis plots the individual beam profiles from 0° to 180°; and z-axis represents the measured voltage drop across the current viewing resistor. This sinogram was taken from an 8 mA, 80 kV elliptical Gaussian beam where the individual beam profiles vary for different scan directions. This variation leads to the peaked sinogram shape where the tall and narrow beam profiles were taken while scanning at right angles to the minor axis of the ellipse, and the short and wide beam profiles were taken while scanning at right angles to the major axis of the ellipse.

Figure 7:
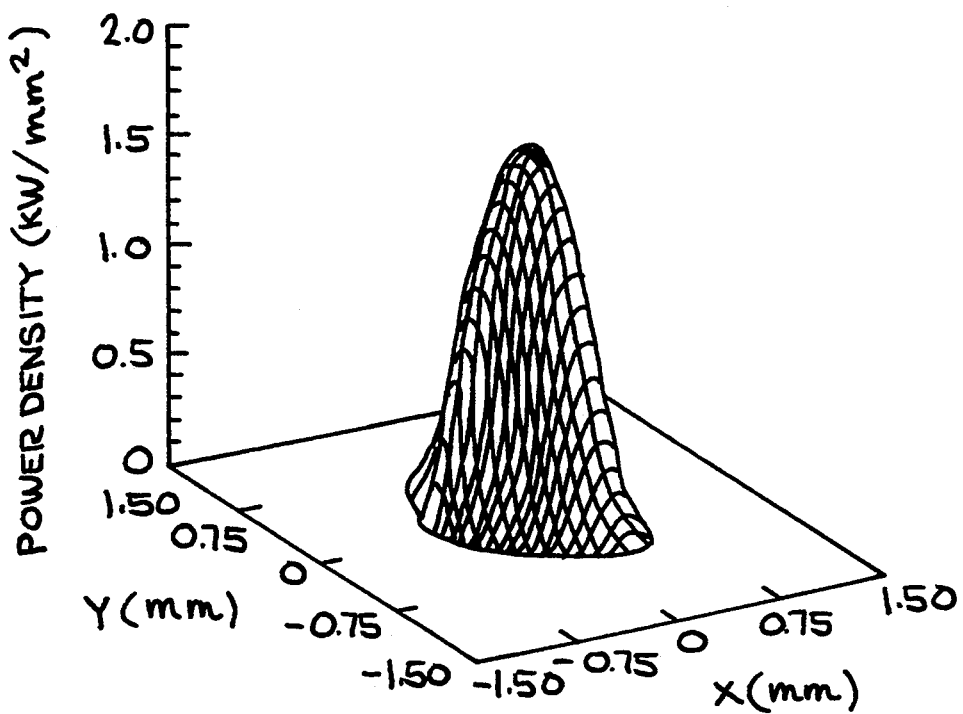
FIG. 7 illustrates a tomographic reconstruction of the power density distribution as a surface plot for an 8 mA, 80 kV, ribbon-filament beam made in accordance with the present invention.
Figure 8:
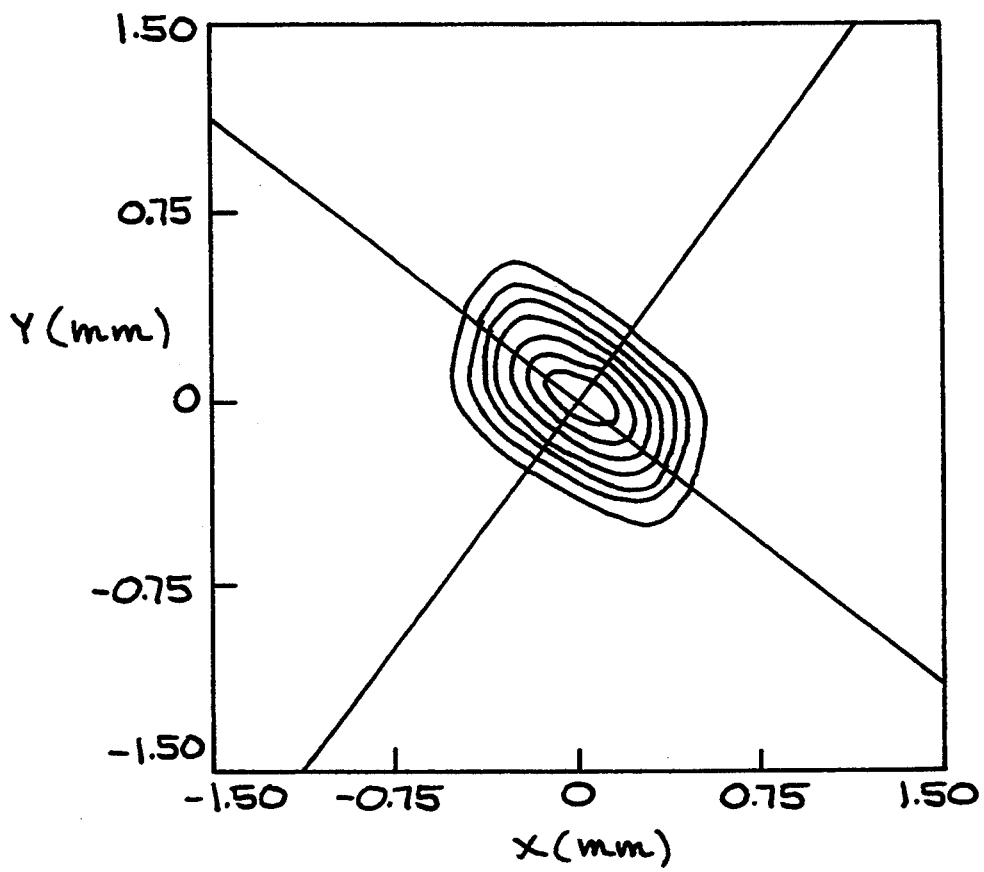
FIG. 8 illustrates a tomographic reconstruction as a contour plot for the same beam utilized in FIG. 7, as produced by the invention.

FIG. 7 shows a surface plot of the power distribution reconstructed from the sinogram in FIG. 6. The axes on this reconstruction have been converted to power density ($kW/mm^2$) on the z-axis, and spatial coordinates (mm) on the x and y axes. From this plot, the peak power density, spatial power distribution, and degree of radial symmetry of the beam can be determined. Other useful tomographic reconstruction formats can be produced such as the contour plot of these same data, which is shown in FIG. 8. FIGS. 7 and 8 illustrate tomographic reconstruction of the power density distribution for an 8 mA, 80 kV, ribbon-filament beam based on 100 beam profiles, see FIG. 6, taken at 3.6° increments from radial scans back and forth around the beam between 0° and 176.4°.

Figure 9:
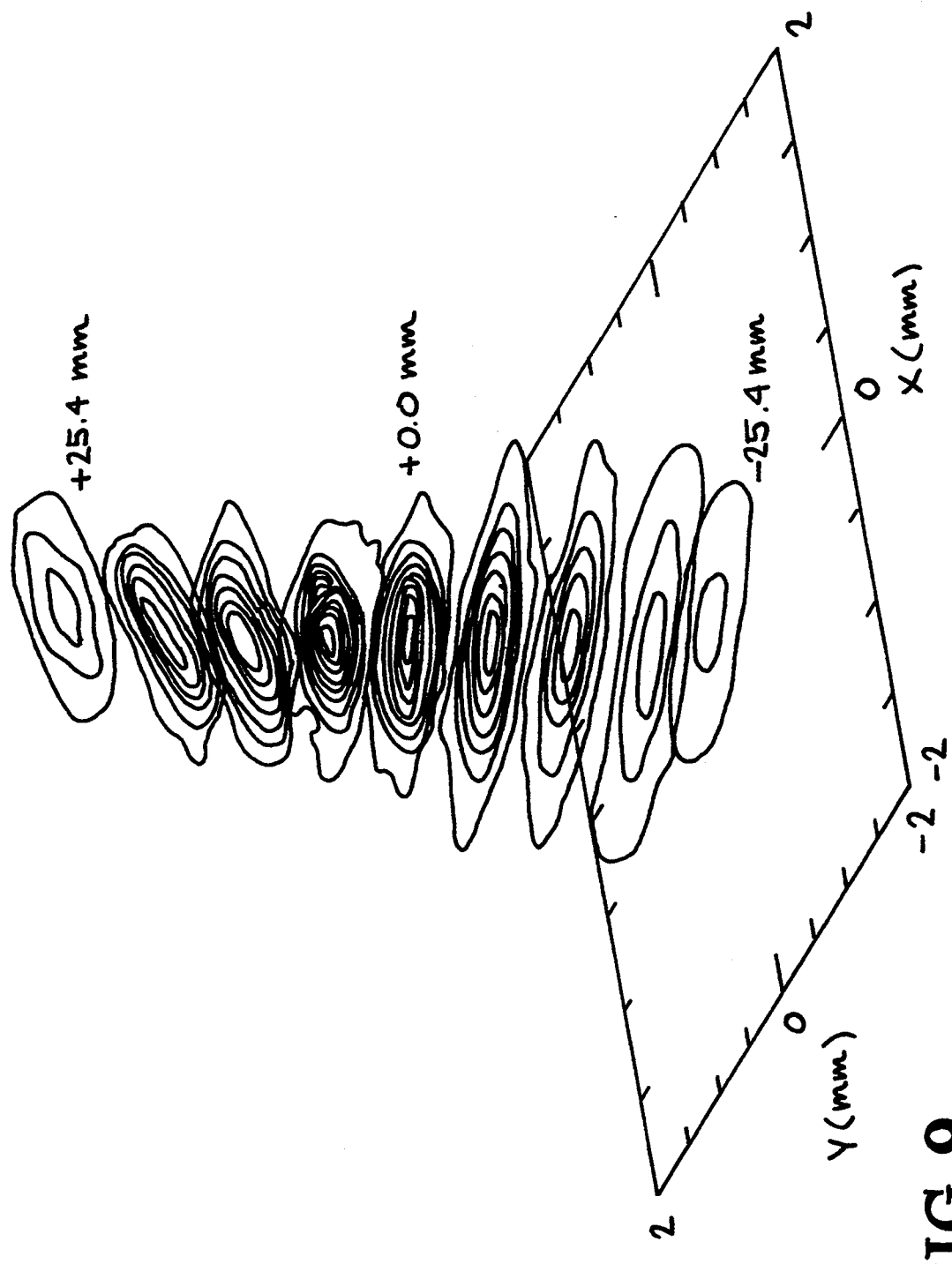
FIG. 9 is a three-dimensional plot of the power distribution near the beam waist of an 8 mA, 100 kV, beam produced by a ribbon filament.

FIG. 9 shows a three-dimensional plot of the power distribution near the beam waist and consists of a series of tomographic images from an 8 mA, 100 kV, ribbon-filament beam at 6.35 mm increments along the beam propagation axis. Here, the images are stacked above each other to illustrate the beam profile from −25.4 to +25.4 mm, where the 0 mm location refers to the point of sharpest focus. It is apparent that the defocused beam has an elliptical shape and the focused beam has a nearly circular shape.

Substantial, experimental efforts have been carried out for verification of the invention relative to various beam configurations and energy, as well as the effects of ribbon and hairpin filaments utilized in the electron beam machines. For further information relative to these experiments see above-referenced UCRL-JC-111341 by J. W. Elmer et al.

The following sets forth the operational steps involved in: A) obtaining beam waveforms via the apparatus illustrated in FIGS. 1 and 3a—3c; and B) utilizing these beam waveforms via CT reconstruction to produce a tomographic image of the beam.

A) Obtaining beam waveforms:
1. Set the beam to the desired focus setting.
2. Move the z-axis stage until the slit is at the desired height.
3. Rotate the cup to 0° measurement angle.
4. Adjust the x-y translation stage to align the beam with the slit.
5. Deflect the beam to one side by turning on the x-y deflection coil.
6. Turn on the beam and wait for full current to be established.
7. Raster the beam back and forth across the slit using the x-y coils.
8. Capture waveform and store.
9. Turn off the beam.
10. Turn off the x-y deflection coil.
11. Rotate cup to next measured angle.

12. Repeat steps 4–11.

B) CT reconstruction:

1. Read waveforms into imaging processing software.
2. Select waveform peaks and select a uniform section around the peaks center of mass.
3. Create sinogram by placing all the peaks in a single array.
4. Create tomogram using the filtered backprojection technique.
5. Display.

It has thus been shown that computer tomographic (CT) imaging can be used as a high resolution method for measuring the power density distribution in high-power and low-power electron beams. This method can be used to analyze the power density distribution of non-circular and irregular beams in order to determine the beam orientation, the shape focus condition along any given scan direction, and the depth of field along the beam propagation axis. When applied to welding, CT imaging can be used to help reduce the amount of operator judgment required to focus and align the beam, improve the reproducibility of the welding process, assist with the modeling of electron beam/material interactions, and assist with the development of new electron guns and filament designs for improved electron beam power density distributions.

It has also been shown that the present invention provides a rotatable/movable modified Faraday cup assembly which can effectively provide information relative to an electron beam which can be utilized directly or in combination with CT techniques to provide a better understanding of the beam energy, characteristics, etc.

While the description of the present invention has been primarily directed to use of the invention for electron beams, particularly high-power, high intensity multiple kilowatt (20 kV plus) electron beams, it can be utilized with low-power (1 kV) beams, as well as for analysis of ion beams. Thus, the invention is not limited only to electron beam applications, such as used in welding machines, but has a wide application for the analysis of any type of energy producing beams, such as the generation of x-rays or use in electron beam lithography.

Also, while particular embodiments, materials, parameters, have been illustrated and/or described, the present invention is not limited thereto. Modifications and changes will become apparent to those skilled in the art, and the scope of this invention is intended to cover such, with the invention to be limited only by the scope of the appended claims.

We claim:

1. A computer tomographic process for determining the power distribution in a beam of energy, comprising the steps of:

obtaining beam profile data by sweeping a beam of energy a plurality of times at different angles across a slit in a modified Faraday cup assembly at the same angle with respect to the slit on each sweep; and reconstructing the power distribution in the beam by processing the thus obtained beam profile data via computer tomography.

2. The process of claim 1, additionally including the steps of repeatedly rotating the slit such that the beam profile data is provided by producing a plurality of waveforms at regularly spaced angles around the beam, and maintaining the beam sweep in a substantially perpendicular direction across the slit.

3. The process of claim 2, wherein the step of producing the waveforms is carried out by capturing beam currents, integrated along an axis of the slit, by the Faraday cup assembly, and recording the current waveform by a digitizing storage oscilloscope.

4. The process of claim 3, additionally including the step of providing means for moving the modified Faraday cup assembly in x, y and z directions for aligning and focusing the modified Faraday cup assembly with respect to the beam of energy.

5. The process of claim 4, additionally including the step of providing means for rotating the modified Faraday cup assembly in a selected controlled sequence the regularly spaced angles of the thus produced plurality of waveforms.

6. The process of claim 5, additionally including the step of providing means for deflecting the beam of energy in a selected, controlled sequence across the slit of the modified Faraday cup assembly at the regularly spaced angles.

7. The process of claim 6, additionally including the steps of forming the slit in the modified Faraday cup by providing the modified Faraday cup with a plurality of members, positioning the pair of members in a spaced relation there between to form the slit so as to have a selected width, and tapering the adjacent surfaces of said plurality of members so as to prevent reflection of current from the beam of energy as it passes through the slit.

8. The process of claim 7, additionally including the step of forming the modified Faraday cup by providing a housing from material capable of dissipating heat, positioning a Faraday cup within the housing, positioning the slit forming members within the housing such that the slit is in alignment with the Faraday cup, providing the housing with an opening which corresponds to the configuration of the slit, and providing the Faraday cup with means including a current viewing resistor for transmitting the captured current to the digitizing storage oscilloscope.

9. The process of claim 8, additionally including the steps of providing the housing with a plate having a slit therein aligned with the opening in the housing, and forming the plate from material capable of protecting the housing from damage by the beam of energy.

10. The process of claim 9, additionally including the step of providing the housing with means for dissipating heat there from.

11. The process of claim 8, additionally including the step of providing electrical grounding means for the housing and the plurality of slit forming members for preventing charge build-up.

12. The process of claim 1, additionally including the step of forming the beam of energy so as to have an energy level of at least about one kilovolt.

13. The process of claim 12, wherein the beam of energy is produced by a charged particle beam selection from the group of ion beams and electron beams.

14. The process of claim 13, wherein the beam of energy is an electron beam produced by an electron beam machine such as utilized for welding, and wherein the energy of the beam is formed so as to be in the range of about 20 kV to about 300 kV with a current in the range of 1 mA to mA.

15. The process of claim 1, wherein the step of reconstructing the power distribution in the beam of energy is carried out by the steps of:
focusing the beam;
adjusting the slit to a desired height;
rotating the cup to a measurement angle;
aligning the beam with the slit in the cup;
deflecting the beam to one side of the slit by the x-y deflection coils;
turning on the beam and establishing full current;
rastering the beam back and forth across the slit;
capturing waveform and store same;
turning off the beam;
turning off the x-y deflection coils;
rotating cup to next measurement angle; and
repeating the subsequent operational steps.

* * * * *